(12) United States Patent
Godfrey

(10) Patent No.: US 6,289,468 B1
(45) Date of Patent: Sep. 11, 2001

(54) TECHNIQUE FOR CONTROLLING SYSTEM BUS TIMING WITH ON-CHIP PROGRAMMABLE DELAY LINES

(75) Inventor: Gary M. Godfrey, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,383

(22) Filed: Nov. 6, 1998

(51) Int. Cl.[7] .................................................... G06F 1/12
(52) U.S. Cl. ................................................................ 713/401
(58) Field of Search ............................. 713/401, 500, 713/600

(56) References Cited

U.S. PATENT DOCUMENTS

| | | | |
|---|---|---|---|
| 4,675,546 | * | 6/1987 | Shaw ..................................... 327/176 |
| 5,448,699 | * | 9/1995 | Goss et al. ............................ 710/102 |
| 6,058,496 | * | 5/2000 | Gillis et al. ........................... 714/727 |

* cited by examiner

*Primary Examiner*—Thomas M. Heckler
(74) *Attorney, Agent, or Firm*—Akin, Gump, Strauss, Hauer & Feld, L.L.P.

(57) ABSTRACT

An on-chip programmable delay line is provided for controlling timing of an embedded system. A delay register is coupled to a processor. The delay register stores a delay or control value responsive to the processor. The on-chip programmable delay line is coupled to the delay register and delays a signal responsive to the delay value. The relationship between dynamic random access memory (DRAM) signals, such as row address strobe (RAS) and column address strobe (CAS), can thus be adjusted. In addition, the on-chip programmable delay line can be utilized with a device that includes an input that is not synchronous to a system clock.

14 Claims, 3 Drawing Sheets

TECHNIQUE FOR CONTROLLING SYSTEM BUS TIMING WITH ON-CHIP PROGRAMMABLE DELAY LINES

CROSS-REFERENCE TO RELATED APPLICATIONS

Not applicable.

STATEMENT REGARDING FEDERALLY SPONSORED RESEARCH

Not applicable.

BACKGROUND OF THE INVENTION

1. Field of the Invention

The invention relates to controlling system bus timing of an embedded system with programmable delay lines, and more specifically to controlling dynamic random access memory (DRAM) associated timing as well as the timing of devices that include an input that is not synchronous to a system clock with programmable delay lines.

2. Description of the Related Art

Embedded systems are generally specialized computer systems that are part of a larger system or machine. Embedded systems have been implemented in various consumer electronics which include watches, microwave ovens, video cassette recorders, and automobiles. A typical embedded system is preprogrammed to perform a dedicated or narrow range of functions with minimal user intervention. In those embedded systems an operating system and various programs are stored in read only memory (ROM). A typical embedded system includes a processor, memory (such as dynamic random access memory (DRAM)), and related peripherals on a single circuit board.

DRAM addressing has normally been accomplished in two stages. In a typical application an address buffer, within the DRAM, initially reads a row address and then reads a column address. These addresses are multiplexed with the multiplexing being controlled by row address strobe (RAS) and column address strobe (CAS) signals. The RAS signal, when asserted, directs the DRAM to accept the address provided as the row address and interpret it accordingly. The CAS signal, when asserted, directs the DRAM to accept the address provided as the column address and interpret it accordingly. In order for the DRAM to function as designed, the duration of the RAS and CAS signals, as well as the time interval between the signals, must meet the specification of the DRAM that is utilized in the embedded system. External delay lines have been utilized to adjust DRAM related timing.

In a typical embedded system each bank of DRAM has similar timing requirements. In those systems, an engineer who tailors memory timing for maximum efficiency of a DRAM bank maximizes efficiency of a memory subsystem.

SUMMARY OF THE INVENTION

An embodiment of the present invention provides an embedded system that is capable of controlling DRAM associated timing. More generally, according to the invention programmable delay lines are provided in a microcontroller to timing critical pads. These programmable delay lines are analog and are not dependent on a system clock. In the disclosed embodiment a delay register is coupled to a processor. The delay register stores a delay or control value responsive to the processor. A delay line or plurality of delay lines are coupled to the delay register and delay a signal responsive to the delay value. In a disclosed embodiment, the signal is a row address strobe (RAS) memory signal. In another embodiment, the signal is a column address strobe (CAS) memory signal.

The delay lines can be programmed, such as by adding delay components in response to the delay register. An advantage of an embodiment of the present invention is that it allows a designer to utilize DRAM with different timing requirements in the embedded system. The programmable delay lines allow for relaxed timing for slower DRAM and tighter timing for faster DRAM. In addition, the invention is applicable to other peripherals or components that have different timing requirements.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF INVENTION

Embedded Controller Overview

Figure 1:
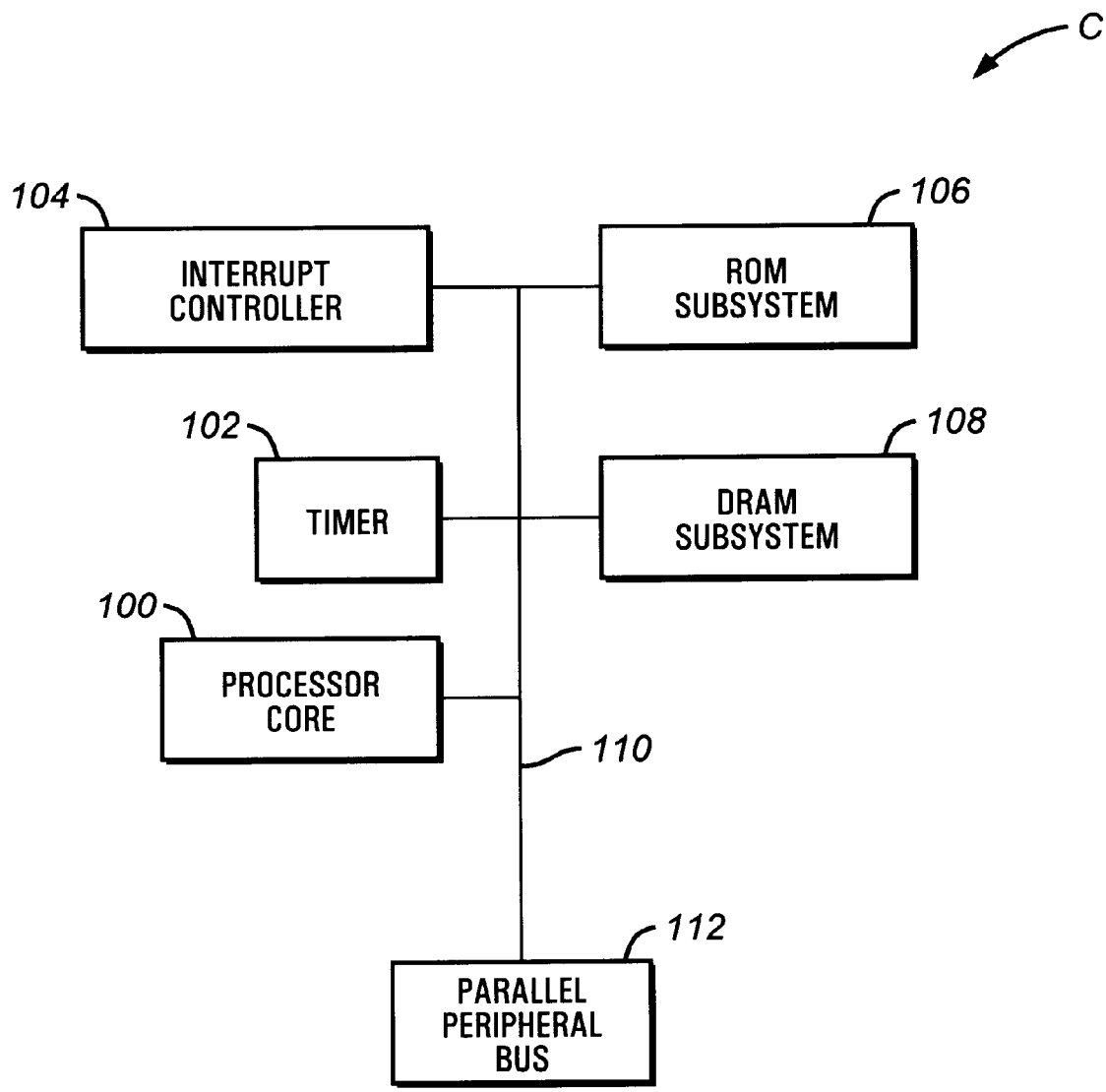
FIG. 1 is a block diagram of an embedded controller C according to an embodiment of the present invention.

Turning to FIG. 1, illustrated is a block diagram of a microcontroller, or embedded controller C, according to an embodiment of the present invention. The embedded controller C as illustrated includes an internal bus 110 which couples a processor 100 to a timer 102, an interrupt controller 104, a ROM subsystem 106, a DRAM subsystem 108, and a parallel peripheral bus 112. The processor 100 in the disclosed embodiment is compatible with the Am 186 instruction set implemented in a variety of microcontrollers manufactured by Advanced Micro Devices Inc. of Sunnyvale, Calif. A variety of other processors could be used instead of the disclosed Am186 instruction set compatible processor 100.

The techniques and circuitry according to the invention could be applied to a wide variety of embedded controllers or microcontrollers. The term "microcontroller" itself has differing definitions in industry. Some companies refer to a processor core with additional features (such as I/O) as a "microprocessor" if it has no onboard memory. Further, digital signal processors (DSPs) are now used for both special and general purpose controller functions. As used herein, the term "microcontroller" covers all of the products, and generally means an execution unit with added functionality all implemented on a monolithic integrated circuit.

As is typical, the timer 102 provides for implementing delays into various routines. The timer 102 can also include a watchdog timer. When incorporated the watchdog timer provides a means of recovery from a system malfunction. In a typical application, if a program fails to reset the watchdog timer within a set interval a hardware reset is initiated. The DRAM subsystem 108 includes a DRAM controller and an appropriate amount of DRAM for the designed application.

The ROM subsystem 106 includes an interface to an application appropriate amount of ROM. The ROM can be a flash ROM or an EEPROM.

As is typical of most systems, the interrupt controller 104 handles hardware or software interrupts. For example, if an external peripheral is attempting to communicate with the embedded controller C, via the parallel peripheral bus 112, it would normally generate an interrupt. That interrupt request is then handled by the interrupt controller 104. The parallel peripheral bus 112 allows the embedded controller C to access external peripherals. The parallel peripheral bus 112 can also serve as a link to allow external access to embedded peripherals of the embedded controller C. For example, the parallel peripheral bus 112 can serve to couple the embedded controller C to other external embedded controllers.

Signal Delay Overview

Figure 2:
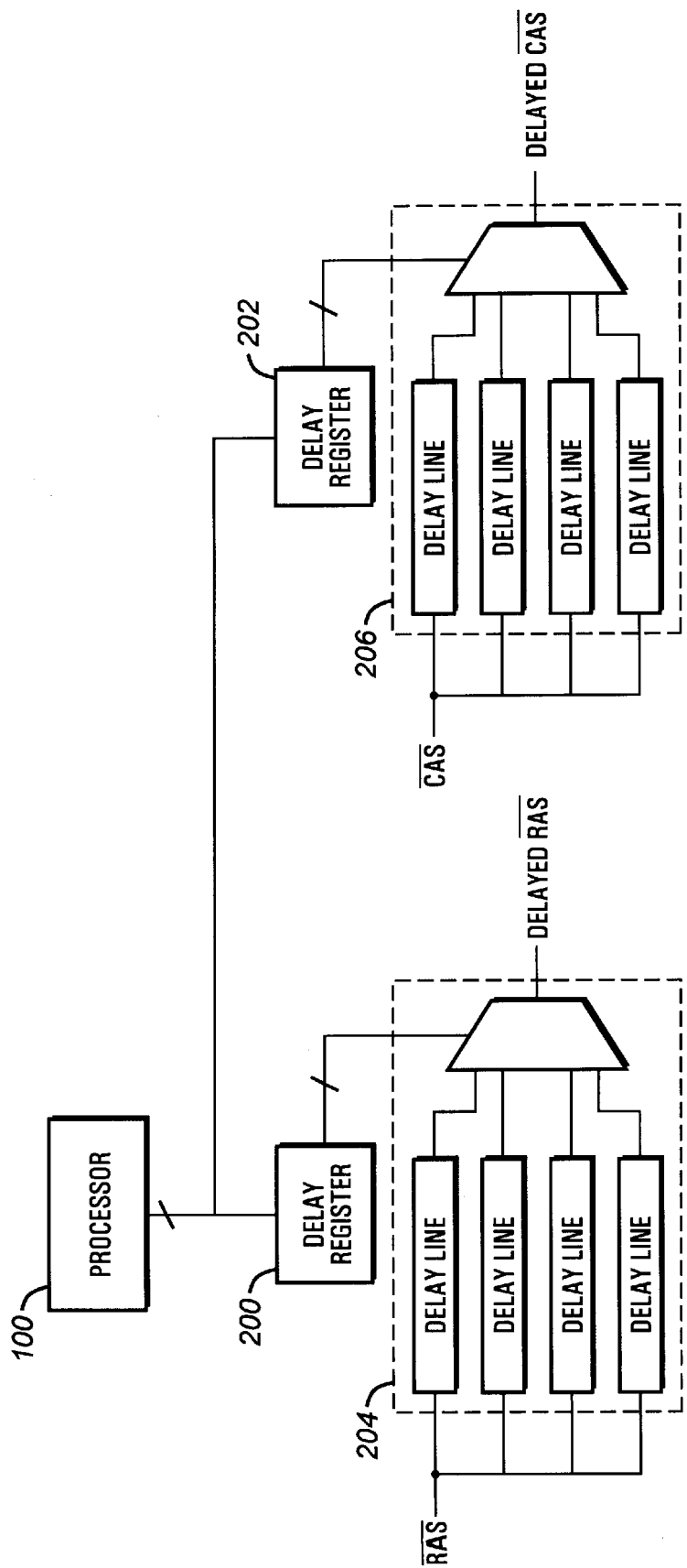
FIG. 2 is a block diagram illustrating programmable delay lines under processor control according to an embodiment of the present invention.

In an embedded system that is capable of utilizing banks of DRAM with different timing requirements it can be advantageous to adjust system timing with programmable delay lines. This is so because mismatches in timing are normally accompanied by wait states. These wait states require timing delays that are system clock dependent. Using programmable delay lines can allow a designer to more precisely account for timing mismatches and reduce the need for wait states. Moving to FIG. 2 a block diagram of programmable delay lines 204 and 206 under processor 100 control is shown. The processor 100 controls the programmable delay lines 204 and 206 by writing data to delay registers 200 and 202. While the processor 100 is shown directly coupled to the delay registers 200 and 202; the processor 100 could control the delay registers 200 and 202 indirectly by writing delay values to system memory. While the delay registers 200 and 202 are shown as separate registers they can, if desired, be incorporated within a single delay register.

The timing delay associated with the RAS and CAS signals is dependent on the values programmed into the delay registers 200 and 202. The delay register 200 controls the delay line 204 and the timing delay associated with the RAS signal. The delay register 202 controls the delay line 206 and the timing delay associated with the CAS signal. In this embodiment both the RAS and CAS signal can be independently delayed. While the delay lines 204 and 206 are shown as separate components they could, in fact, be incorporated within a single component. In the disclosed embodiment, the delay lines 204 and 206 are incorporated within the DRAM subsystem of the embedded controller C. The delay lines 204 and 206 are analog delay lines that are not synchronous to a system clock. An advantage of using analog delay lines is that the time delay increments are not limited by the system clock.

Other non-memory related applications can also benefit from the techniques of the present invention. For example, any peripheral or component signal, such as a programmable I/O line, can be skewed which can serve to reduce required wait states. Further, signals originating from legacy peripherals and buses that are not synchronous to an internal clock can be delayed, as needed. In addition, providing delay lines on certain device inputs can also serve to delay requests from those devices. In the disclosed embodiment, programmable delay lines are incorporated within the chip design and located between an input/output and a chip pad.

Figure 3:
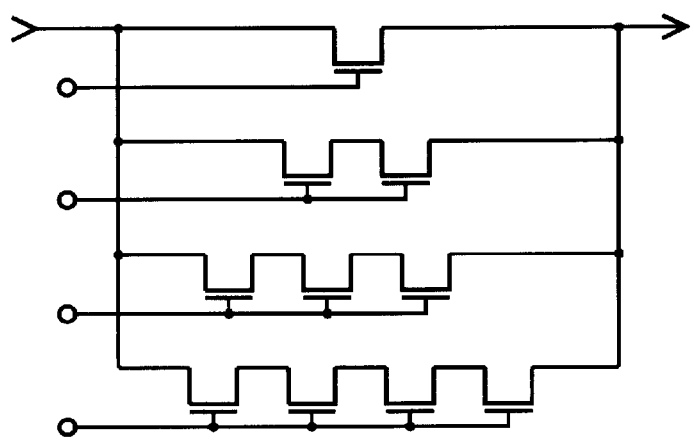
FIG. 3 is a schematic illustrating a programmable delay line embodiment.

The make-up of the delay lines 204 and 206 is not otherwise critical to the invention and could be of various construction. The delay lines 204 and 206 could be programmed by switching in/out additional delay elements or by providing multiple lines with different associated timing delays. For example, the delay lines 204 and 206 could be field effect transistors (FETs) where the propagation delay of one or more FETs is used to implement the delay (see FIG. 3). In this embodiment multiple FETs could be serially connected to achieve the desired delay. In this embodiment the gates of the FETs are coupled to and controlled by the delay values stored in the delay registers 200 and 202.

Figure 4:
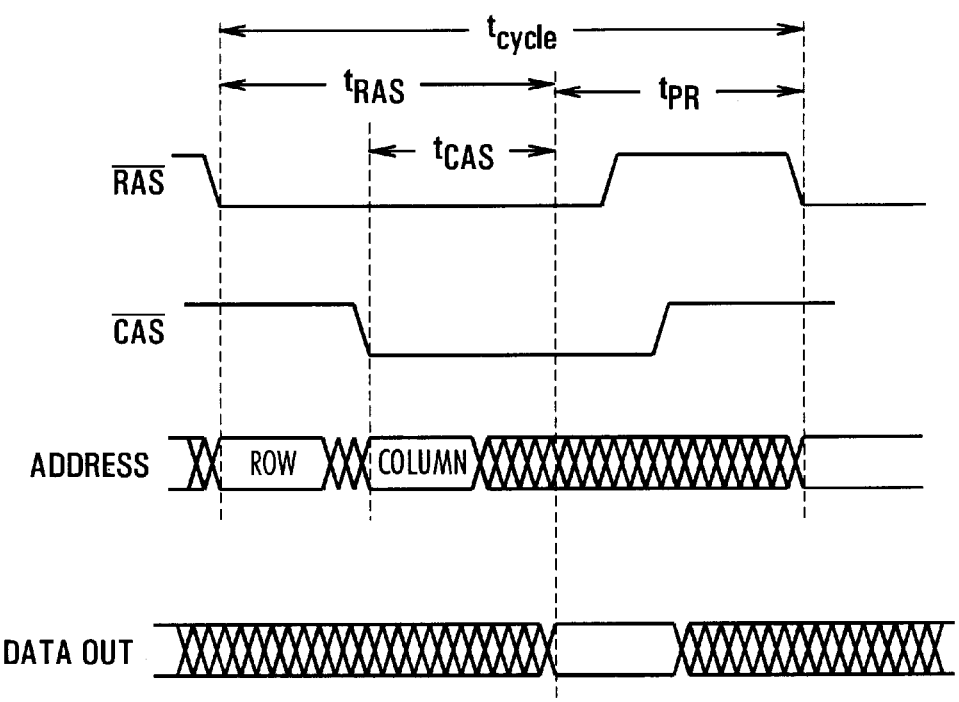
FIG. 4 is a timing diagram illustrating RAS and CAS signals and their relationship to address and data signals.

Moving to FIG. 4 RAS, CAS, address, and data out signals associated with DRAM and there relationships are illustrated. RAS time ($t_{RAS}$) is defined to be the time from assertion of the RAS signal until output data is available. CAS time ($t_{CAS}$) is defined to be the time from assertion of the CAS signal until the output data is available. RAS precharge time ($t_{PR}$) is the time required for precharging and equalizing a charge on a given cell. The RAS precharge time is dependent upon the memory architecture and affects a DRAM's cycle time. The DRAM's cycle time ($t_{CYCLE}$) is equal to the sum of the RAS time ($t_{RAS}$) and the RAS precharge time ($t_{PR}$). The cycle time ($t_{CYCLE}$) is defined as the time in which successive RAS signals can occur and is known as DRAM access time.

One of skill in the art can readily appreciate that a DRAM's cycle time ($t_{CYCLE}$) is not adjustable using programmable delays of the present technique. However, using the programmable delays of the disclosed embodiment the relationship between the RAS signal and the CAS signal can be adjusted, within specification. This allows a design engineer to utilize banks of DRAM with different timing requirements and in turn to maximize the efficiency of those banks of DRAM.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method of controlling component associated timing, the method comprising the steps of:

determining a required delay for a signal associated with the component;

setting a delay register external to the component to a delay value corresponding to the required delay; and delaying the signal with programmable delay lines that are incorporated within the component responsive to the set delay value of the delay register, wherein the delay is an analog delay independent of a system clock.

2. The method of claim 1, wherein the component is a DRAM and the signal is a RAS memory signal.

3. The method of claim 1, wherein the component is a DRAM and the signal is a CAS memory signal.

4. An apparatus for controlling component associated timing, the apparatus comprising:

a delay register external to the component for storing a delay value; and a programmable delay line for delaying a signal associated with the component responsive to the delay value, wherein the programmable delay line is incorporated within the component.

5. The apparatus of claim 4, wherein the component is a DRAM and the signal is a RAS memory signal.

6. The apparatus of claim 4, wherein the component is a DRAM and the signal is a CAS memory signal.

7. An embedded system adapted to control component associated timing, the embedded system comprising:

a processor;

a delay register coupled to the processor, the delay register storing a delay value responsive to the processor; and a programmable delay line coupled to the delay register, the delay line delaying a signal associated with the component responsive to the delay value, wherein the programmable delay line is incorporated within the component.

8. The embedded system of claim 7, wherein the component is a DRAM and the signal is a RAS memory signal.

9. The embedded system of claim 7, wherein the component is a DRAM and the signal is a CAS memory signal.

10. A microcontroller adapted to control component associated timing, the microcontroller comprising:

a processor;

a delay register coupled to the processor, the delay register storing a delay value responsive to the processor; and a programmable delay line coupled to the delay register, the delay line delaying a signal associated with the component responsive to the delay value and coupling the delayed signal to a pad, wherein the programmable delay line is incorporated within the component.

11. The microcontroller of claim 10, wherein the component is a DRAM and the signal is a RAS memory signal.

12. The microcontroller of claim 10, wherein the component is a DRAM and the signal is a CAS memory signal.

13. The microcontroller of claim 10, wherein the signal is a programmable I/O signal.

14. The microcontroller of claim 10, wherein the signal is a peripheral device signal.

* * * * *